United States Patent [19]

McCoy

[11] Patent Number: 5,259,888

[45] Date of Patent: Nov. 9, 1993

[54] PROCESS FOR CLEANING QUARTZ AND SILICON SURFACES

[75] Inventor: Scott I. McCoy, Chicago, Ill.

[73] Assignee: Sachem, Inc., Austin, Tex.

[21] Appl. No.: 830,688

[22] Filed: Feb. 3, 1992

[51] Int. Cl.$^5$ .......................... B08B 3/04; B08B 3/08; C03C 23/00; C23G 1/00

[52] U.S. Cl. ............................................ 134/2; 134/38

[58] Field of Search ...................... 134/2, 38

[56] References Cited

U.S. PATENT DOCUMENTS

| | | | |
|---|---|---|---|
| 4,113,551 | 9/1978 | Bassous et al. | 156/662 |
| 4,202,703 | 5/1980 | Zuber et al. | 134/2 |
| 4,239,661 | 12/1980 | Muraoka et al. | 252/541 |
| 4,556,629 | 12/1985 | Poulin et al. | 430/331 |
| 4,592,856 | 6/1986 | Kobayashi et al. | 134/38 |
| 4,714,530 | 12/1987 | Hale et al. | 204/131 |
| 4,744,834 | 5/1988 | Haq | 134/38 |
| 4,914,006 | 4/1990 | Kato et al. | 430/331 |

OTHER PUBLICATIONS

"Quartzware Cleaning Technology" in Solid State Technology, vol. 31, No. 1, Jan. 1988, pp. 79-80.

*Primary Examiner*—Theodore Morris
*Assistant Examiner*—Zeinab El-Arini
*Attorney, Agent, or Firm*—Renner, Otto, Boisselle & Sklar

[57] ABSTRACT

A process for cleaning quartz and silicon surfaces by removing inorganic substances from said surfaces which comprises contacting the surface to be cleaned with a liquid at a temperature and for a period of time effective to remove said substances from the surface, said liquid comprising a solution in a solvent of at least one quaternary ammonium hydroxide characterized by the formula

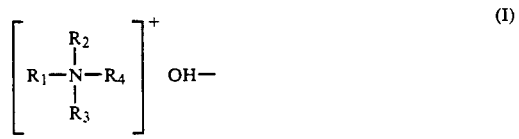

wherein $R_1$, $R_2$, $R_3$ and $R_4$ are each independently alkyl groups containing from 1 to about 10 carbon atoms, aryl groups, or $R_1$ and $R_2$ are alkylene groups which together with the nitrogen atom may form an aromatic or non-aromatic heterocyclic ring provided that if the heterocyclic group contains a —C≡N— bond, $R_3$ is the second bond.

19 Claims, No Drawings

PROCESS FOR CLEANING QUARTZ AND SILICON SURFACES

TECHNICAL FIELD

This invention relates to a method for cleaning quartz and silicon surfaces. More particularly, the invention relates to a method of removing inorganic substances from quartz and silicon surfaces which does not require an acid etching step.

BACKGROUND OF THE INVENTION

The present invention relates to a process for cleaning quartz and silicon surfaces which are contaminated with inorganic substances. In particular, the invention related to the cleaning of such surfaces for application which require a clean and smooth surface. The surface may be any surface of a quartz or silicon semiconductor device, or the surface may be the quartz surface (usually inner) of equipment used in the manufacture of semiconductor devices. For example, the invention is useful in cleaning silicon wafers or disks.

The present invention also relates to a process for cleaning quartzware used in the manufacture of semiconductor devices. The types of quartzware used in such a manufacture include quartz diffusion tubes, quartz dummy wafers, quartz injector tubes, quartz paddles, quartz cantilevers, quartz pull rods, quartz wafer boats, quartz thermocouple sheaths, quartz bell jars, and epitaxial reactor vessels. In the interest of maintaining purity, it is common to manufacture semiconductors in vessels made of quartz. Quartz diffusion tubes and quartz epitaxial reactors are used in the semiconductor industry to carry out chemical vapor deposition. During a chemical vapor deposition, for example, silicon wafers are enclosed within the quartz diffusion tube, and then vapors of, for example, mixtures of silicon tetrachloride and hydrogen are introduced into the tube. These vapors act on the silicon wafer to form the desired silica deposit on the wafers. These materials may also deposit on the reaction tube and subsequently flake off and contaminate the film surface. These processes also result in the deposition of silicon (polysilicon) as well as other metals and metal compounds on the inner surface of the tube. Before the quartz tube can be reused, these contaminants must be removed from the inner surface of the tube. Conventionally, this has been accomplished by immersing the tube in a vessel containing a reagent, usually a mixture of nitric acid and hydrofluroic acid, and then rinsing the tube thoroughly with deionized water. It also has been suggested to clean the surface by heating the vessel under vacuum or in hydrogen.

Use of the above-mentioned conventional process of cleaning with one or more inorganic acids has not been entirely satisfactory because the acids, in addition to removing the deposits on the surface, will also etch the quartz surface and convert the previously smooth surface to a rather rough surface which has a greater tendency to become contaminated in subsequent use and which results in a reduction in yield of acceptable wafers. Thus, the process of cleaning a quartz surface with acids may be followed by a polishing step. Each time the quartzware is cleaned with acid, the acid etches away an additional amount of the quartz from the quartzware, increases the surface area of the quartzware, and reduces the remaining life of the part. If a diffusion tube is cleaned by immersion in strong acid, etching of the exterior surface of the tube also results thereby further unnecessarily shortening the life of the tube.

In addition, acids such as nitric acid and hydrofluoric acid require special handling procedures because the acids are hazardous since they are highly corrosive and toxic, and can cause severe and painful chemical burns if brought into contact with human skin. Moreover, the reaction of nitric acid with the silicon produces a toxic nitrous oxide gas which requires that the cleaning operation be conducted under special equipment such as a ventilated hood, and there is still the possibility of exposure to the toxic gas.

Procedures have been described in patents and in various publications for cleaning the surfaces, and particularly the inner surfaces, of quartzware. In the article entitled "Quartzware Cleaning Technology" in *Solid State Technology*, Vol. 31, No. 1, January 1988, pp. 79-80, a nine-step cleaning cycle is described which includes several rinsing steps, a degreasing step utilizing heated choline (trimethyl-2-hydroxyethyl ammonium hydroxide), a concentrated acid etching step which is reported to remove virtually all deposits including polysilicons from the quartzware, and a polishing step using a dilute acid. The degreasing step is reported to remove organic contaminants such as finger oils, greases, particles and organic compounds without any degrading residue. The degreasing step is accomplished by placing the quartzware in an enclosed exhausted compartment which locks prior to a timed dispense of heated dilute choline.

U.S. Pat. No. 4,239,661 describes a surface-treating agent for removing organic and inorganic contaminants deposited on the surface of intermediate semiconductor products. The surface-treating agent which is also useful for eliminating those portions of a positive working photoresist film coated on the surface of the intermediate semiconductor product comprises an aqueous solution containing one or more of trialkyl(hydroxyalkyl)ammonium hydroxides. Examples of such hydroxides identified in the patent include trimethyl(2-hydroxyethyl)ammonium hydroxide, also referred to as "cholin", triethyl(2-hydroxyethyl)ammonium hydroxide, tripropyl(2-hydroxyethyl)ammonium hydroxide, etc. The patentees report that where the surface portion of intermediate products obtained in the manufacturing of a semiconductor device is washed with the surface-treating agent, the semiconductor product is immersed for 5 to 20 minutes and the agent maintained in a 70°-90° C., and the product is preferably subjected to ultrasonic cleaning. Silicon wafers are used as an example of the intermediate semiconductor product which can be treated with the agents described in the patent.

The use of acids and acid mixtures for cleaning deposited matter such as silicon and other contaminants from the interior of a quartz diffusion tube and other quartzware is described in, for example, U.S. Pat. No. 4,294,271, and various publications such as White, "Clean Surface Technology", Symp. on Freq. Control, 27th Ann. Proc. Pap., Cherry Hill, N.J. Jun. 12, 1975, pp. 79-88 and J. Bardina, "Methods for Surface Particle Removal: Comparative Study", Particulate Science and Technology 6:121-131, 1988. In the publication by White, aqueous systems comprising hydrogen peroxide; a mixture of hydrogen fluoride and nitric acid; and a mixture of hydrofluoric acid with ammonium fluoride are described. In the Bardina publication, various etching solutions are described on page 128, and these include a mixture of water, hydrogen peroxide and ammonium hydroxide.

U.S. Pat. No. 3,673,099 describes the procedure for stripping cured resins such as silicones or polyvinyl cinnamate from substrates by exposure to a mixture of N-methyl-2-pyrrolidone and a strong base such as an alkyl or substituted-alkyl ammonium hydroxide. Compatible solvents may also be included such as ethylene glycol monoethyl ether.

U.S. Pat. No. 4,089,704 describes a procedure for removing RTV silicon rubber encapsulants from electronic circuits. The encapsulant is broken down molecularly and removed by a solution of tetramethylammonium hydroxide which is diluted with an alcohol such as 2-propanol. This stripping solution is reported to cause minimal swelling of the encapsulant and leaves no significant residue which cannot be removed by standard rinsing.

SUMMARY OF THE INVENTION

A process for cleaning quartz and silicon surfaces by removing inorganic substances from said surfaces is described which comprises contacting the surface to be cleaned with a liquid at a temperature and for a period of time effective to remove the substances from the surface, said liquid comprising a solution in a solvent of at least one quarternary ammonium hydroxide characterized by the formula

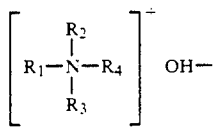

(I)

wherein $R_1$, $R_2$, $R_3$ and $R_4$ are each independently alkyl groups containing from 1 to about 10 carbon atoms, aryl groups, or $R_1$ and $R_2$ together with the nitrogen atom may form an aromatic or non-aromatic heterocyclic ring provided that if the heterocyclic group contains a —C=N— bond, $R_3$ is the second bond. In one particular embodiment, the liquid comprises an aqueous or alcoholic solution comprising the solvent and the quaternary ammonium hydroxide. A particular application of the process is in removing polysilicon from quartz and silicon surfaces without significant etching of the surfaces.

DESCRIPTION OF THE PREFERRED EMBODIMENTS

The liquid which is used to clean the quartz and silicon in accordance with this invention comprises a solvent and at least one quaternary ammonium hydroxide characterized by the formula

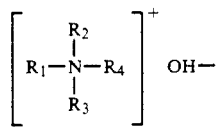

(I)

wherein $R_1$, $R_2$, $R_3$ and $R_4$ are each independently alkyl groups containing from 1 to about 10 carbon atoms, aryl groups, or $R_1$ and $R_2$ are each alkylene groups joined together with the nitrogen atom may form an aromatic or non-aromatic heterocyclic ring provided that if the heterocyclic group contains a —C=N— bond, $R_3$ is the second bond.

In one preferred embodiment, $R_1$, $R_2$, $R_3$ and $R_4$ are each independently alkyl groups containing from 1 to about 10 carbon atoms, and in another embodiment the alkyl groups contain from 1 to 4 carbon atoms.

Specific examples of alkyl groups containing from one to 10 carbon atoms include methyl, ethyl, propyl, butyl, pentyl, hexyl, heptyl, octyl, nonyl, and decyl groups. Examples of various aryl groups include phenyl, benzyl, and equivalent groups.

Examples of specific quaternary ammonium hydroxides which can be used in the process of the present invention include tetramethylammonium hydroxide, tetraethylammonium hydroxide, tetrapropylammonium hydroxide, trimethylethylammonium hydroxide, tetrabutylammonium hydroxide, phenyltrimethylammonium hydroxide, phenyltriethylammonium hydroxide, benzyltrimethylammonium hydroxide, etc.

In one preferred embodiment, the quarternary ammonium hydroxides are tetramethylammonium hydroxide (TMAH) or tetraethylammonium hydroxide (TEAH).

The quaternary ammonium hydroxides useful in the process of the present invention may include cyclic quaternary ammonium hydroxides. By "cyclic quaternary ammonium hydroxide" is meant compounds in which the quaternary substituted nitrogen atom is a member of a non-aromatic ring of between 2 to about 8 atoms or an aromatic ring of from 5 or 6 atoms in the ring. That is, in Formula I, $R_1$ and $R_2$ together with the nitrogen atom form an aromatic or non-aromatic heterocyclic ring. If the heterocyclic ring contains a —C=N— bond (e.g., the heterocyclic ring is an unsaturated or aromatic ring), then $R_3$ in Formula I is the second bond.

The quaternary nitrogen-containing ring optionally includes additional heteroatoms such as sulfur, oxygen or nitrogen. The quaternary nitrogen-containing ring may also be one ring of a bicyclic or tricyclic compound. The quaternary nitrogen atom is substituted by one or two alkyl groups depending on whether the ring is aromatic or non-aromatic, and the two groups may be the same or different. The alkyl groups attached to the nitrogen are preferably alkyl groups containing from 1 to 4 carbon atoms and more preferably methyl. The remaining members of the quaternary nitrogen ring may also be substituted if desired. Cyclic quaternary ammonium hydroxides useful in the process of the present invention may be represented by the following Formula IA

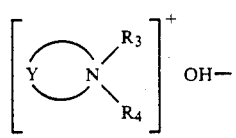

(IA)

wherein $R_3$ and $R_4$ are each independently alkyl groups containing from 1 to 10 carbon atoms, preferably 1 to 4 carbon atoms, and more preferably methyl, and Y is an oxygen, sulfur or nitrogen atom. When the heterocyclic ring is an aromatic ring (i.e., a —C=N— bond is present), $R_3$ is the second bond on the nitrogen.

Cyclic quaternary ammonium hydroxides can be prepared by techniques well known to those skilled in the art. For example, cyclic quaternary ammonium salts may be obtained by first preparing the N-methyl derivative by reaction with methyl chloride followed by an ion exchange to convert the chloride to a hydroxide. Examples of hydroxides which can be prepared in this manner include: N,N-dimethyl-N'-methyl pryizinium hydroxide; N,N-dimethylmorpholinium hydroxide; and N-methyl-N'-methyl imidazolinium hydroxide. Other cyclic quaternary ammonium hydroxides may be prepared from other heterocyclic compounds such as pyridine, pyrrole, pyrazole, triazole, oxazole, thiazole, pyridazine, pyrimidine, anthranil, benzoxazole, quinazoline, etc., or derivatives thereof. Procedures for preparing the cyclic hydroxides are known in the art and are described in, for example, U.S. Pat. No. 4,556,629 which patent disclosure is hereby incorporated by reference. Example 1 of the patent describes the preparation of N-methylpyridinium hydroxide.

The quaternary ammonium hydroxides which are useful in the cleaning process of the present invention are soluble in various protic or non-protic solvents such as water, alcohols, etc. Thus, the liquid which is utilized in the process of the present invention and which comprises one or more of the above-described quaternary ammonium hydroxides may be dissolved which is a solvent for the quaternary ammonium hydroxide. Aqueous solutions of the quaternary ammonium hydroxides are preferred in the practice of the invention, but other solvents may be used including alcohols such as methanol, ethanol, propanol, ethylene glycol, diethylene glycol, glycerol, etc., ethers such as diethylether, dipropylether, diglymes, and amines such as tributylamine. When a solution of the quaternary ammonium hydroxides as described above is used, the solution may contain from about 0.1 to about 60% by weight or more of the quaternary ammonium hydroxide. In other embodiments, the solution may comprise from about 5 to about 40% by weight or from about 10 to about 15% by weight of the quaternary ammonium hydroxide. Mixtures of solvents also may be used. Aqueous solutions of the quaternary ammonium hydroxides are presently preferred in the practice of the method of the present invention.

The aqueous solutions of quaternary ammonium hydroxides which can be used in accordance with the process of the present invention may be prepared by any of the known techniques. Generally, the quaternary ammonium hydroxides are quaternary ammonium hydroxides manufactured by electrolyzing aqueous solutions of quaternary ammonium salts, particularly a quaternary ammonium halide, in an electrolysis cell containing a diaphragm formed of a cation-exchange membrane. Procedures such as described in U.S. Pat. Nos. 4,572,969; 4,521,285; 4,425,202; and 4,394,226 may be used to prepare the quaternary ammonium hydroxides.

In most applications, it is essential to use highly pure quaternary ammonium hydroxides. High purity quaternary ammonium hydroxides and methods of preparing these are described in U.S. Pat. Nos. 4,714,530 and 4,938,854.

The aqueous solutions of quaternary ammonium hydroxides which are available commercially include aqueous solutions of tetrabutylammonium hydroxide available in concentrations of up to about 55% by weight, tetramethyl ammonium hydroxide and tetraethyl ammonium hydroxide available at concentrations of from about 15 to about 40% by weight. These commercially available aqueous solutions can be diluted with water to produce an aqueous solution suitable for cleaning quartz surfaces in accordance with the method of the present invention.

The aqueous solutions and alcoholic solutions of the quaternary ammonium hydroxides which are used in the present invention may contain other components which improves the ability of the liquid to remove polymeric substances, metals and/or metal oxides and other impurities which may be present on the quartz surface. For example, if the quartz surface is also contaminated with heavy metals, the aqueous liquid used to clean the surface may contain various water-soluble complexing agents which are capable of forming a water-soluble complex with the metal. Complexing agents which may be utilized include sodium cyanide, ammonium cyanide, sodium ethylenediamine tetraacetate, potassium ethylenediamine tetraacetate, triethanolamine, ethylenediamine, ethylenediamine tetraacetic acid, etc. When a complexing agent is included in the aqueous solutions, the amount of the complexing agent included in the liquid should not be so large to result in harmful effects such as the deposition of sodium or potassium salts on the quartz surfaces being cleaned. Generally, amounts of from about 0.1 to about 5 parts by weight of the water-soluble complexing agent is sufficient.

The aqueous and alcoholic compositions of the present invention may also contain supplemental surfactants in amounts of from about 0.01 to about 5 parts by weight, and more often from about 0.1 to about 2 parts by weight. The surfactant may be an anionic surfactant, cationic surfactant or nonionic surfactant. In one embodiment, nonionic surfactants are preferred.

Preferred examples of nonionic surfactants include surfactants of the polyoxyethylene type such as represented by the formulae $ArO(CH_2CH_2O)_mH$ and $RO(CH_2CH_2O)_mH$ wherein R is an alkyl group containing from about 12 to about 18 carbon atoms, m is a number of from about 8 to about 15, and Ar is an aryl group which may contain one or more alkyl substituents containing up to 8 or 9 carbon atoms.

Cationic surfactants which may be utilized include quaternary ammonium salts represented by the general Formula II

(II)

wherein R is an alkyl group containing from 8 to about 18 carbon atoms, $R_1$ and $R_2$ are each independently alkyl groups having from 1 to 4 carbon atoms, and $R_3$ is an alkyl group containing from 1 to 4 carbon atoms or a hydroxyalkyl group having from 1 to 4 carbon atoms, and X is a halogen atom. One useful type of quaternary ammonium salt represented by Formula II is where $R_2$ thru $R_4$ are each methyl groups. Specific examples of cationic surfactants represented by Formula II include dodecyltrimethyl ammonium chloride, decyltriethyl ammonium bromide, hexadecyltrimethyl ammonium chloride, etc.

Alternatively, the cationic surfactant may be a pyridinium salt or a picolinium salt represented by the general Formula III

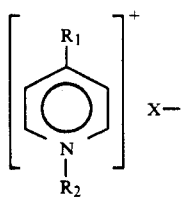
(III)

wherein $R_1$ is an alkyl group containing from about 12 to about 16 carbon atoms and $R_2$ is a hydrogen atom or a lower alkyl group such as a methyl group, and X is a halogen atom. Examples of cationic surfactants is represented by Formula III include dodecyl-pyridinium chloride and dodecyl-picolinium chloride.

Quartz surfaces can be cleaned in accordance with the method of the present invention by contacting the surface to be cleaned with a liquid which comprises a solution containing an effective amount of the above-described quaternary ammonium hydroxides. The liquid may be solutions of any of the quaternary ammonium hydroxides described above in various protic and non-protic polar organic solvents as described above.

In the process of the present invention, the quartz surface to be cleaned is contacted with the solutions comprising the quaternary ammonium hydroxides at a temperature and for a period of time which is effective to clean the quartz surface and to remove the undesired substances present on such surfaces. Although ambient temperature can be utilized, it is generally preferred to use liquids which have been heated to an elevated temperature. In one embodiment, the surfaces are cleaned by contact with the liquid at temperatures of at least about 50° C., and generally from about 50° to about 95° C. In one preferred embodiment, contact with the liquid is at a temperature of from about 70° to about 95° C. At the elevated temperatures, the period of contact to achieve the desired clean surface is generally less than at lower temperatures.

Contact between the liquids and the surface to be cleaned can be effected by methods well known in the art. For example, the surface to be cleaned can be immersed in the liquid or the surface can be sprayed or flooded with the liquid. Generally, optimum results are obtained when the quartz surface is immersed in the liquid comprising the above-described quaternary ammonium hydroxides.

The process of the present invention results in a quartz surface which does not appear to be significantly etched by the quaternary ammonium hydroxide solutions. The surfaces are cleaned, and any undesirable substances present on the surface prior to cleaning are removed by the cleaning process. Undesirable substances which are removed by the process include inorganic materials such as polysilicon, a form of crystalline silicon, metals such as aluminum, phosphorus, boron, titanium, tungsten, etc., and metal oxides.

When the surface to be cleaned is contaminated with poloysilicon and silica which may form on the surface due to oxidation of the silicon, it may be desirable to subject the surface to a precleaning step by contacting the surface with a dilute acid such as a 1% aqueous solution of HF to remove the silica. After precleaning in this manner the polysilicon can be removed in accordance with the process of the invention.

When the present process is utilized, it is unnecessary to subject the cleaned quartz surface to an acid treatment or even a subsequent polishing treatment after the surface is treated with the solution of the quaternary ammonium hydroxide since the surfaces treated in accordance with the process of the present invention are clean and generally smooth.

The following examples illustrate the process of the present invention.

EXAMPLE 1

A silicon wafer which has been coated with two spray coats of hexamethyldisilane in accordance with normal spray coating procedures used in a semi-conductor industry is cleaned by immersing the coated silicon wafer in an aqueous solution comprising water and 0.5% by weight of tetramethylammonium hydroxide at a temperature of about 50° C. for a period of about 10 minutes. Upon removing the coated silicon wafer from the solution, rinsing and drying, the coating is smooth, and surface inperfections and extraneous deposits on the coating are removed. There is no significant increase in surface area.

EXAMPLE 2

A used diffusion tube containing impurities and deposits on the inner surface is immersed in an aqueous solution comprising water and about 12% by weight of tetramethylammonium hydroxide at a temperature of about 80°-90° C. The diffusion tube is periodically removed from the aqueous solution for observation, and when it appears that the impurities and deposits have been removed from the inner surface, and the inner surface appears smooth and polished, the treated diffusion tube is rinsed with water and dried. The inner surface of a used diffusion tube treated in this manner has a clean, smooth and polished inner surface and can be reused in producing additional semiconductors. There is no significant increase in surface area. It is not necessary to etch the inner surface with concentrated acid.

EXAMPLE 3

In this example, an epitaxial reaction chamber which has been used for growing epitaxial films of semiconductor material on the surface of a substrate is cleaned. The inner surfaces of the reactor contains various substances and deposits as a result of, for example, the epitaxial vapor deposition of a film on a substrate wherein the vapor comprises a material such as silicon tetrachloride mixed with hydrogen. The silicon tetrachloride is reduced by hydrogen to form silicon and hydrogen chloride gas on contacting the hot substrate. The silicon from this reaction deposits on the surface of the substrate, and monocrystalline silicon grows epitaxially on the substrate. Particles of the silicon generated in this process deposit on the inner surfaces of the reactor, generally as polysilicon. The deposits which are present on the described epitaxial reactor can be removed in accordance with the process of the present invention by filling the reaction chamber with an aqueous solution containing about 12% by weight of tetramethylammonium hydroxide and heating the solution to a temperature of about 85°-90° C.

Reaction chambers used in epitaxially growing germanium and silicon are usually made of fused quartz.

Silicon or germanium materials which are deposited on the inner chamber walls are undesirable and may be removed by contact with quaternary ammonium hydroxides in accordance with the process of the present invention.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. A process for cleaning quartz and silicon surfaces by removing inorganic substances from said surfaces which comprises contacting the surface to be cleaned with a liquid at a temperature and for a period of time effective to remove the substances from the surface, said liquid comprising a solution in a solvent of at least one quaternary ammonium hydroxide characterized by the formula

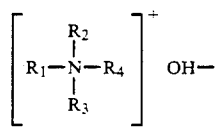 (I)

wherein $R_1$, $R_2$, $R_3$ and $R_4$ are each independently alkyl groups containing from 1 to about 10 carbon atoms, aryl groups, or $R_1$ and $R_2$ are alkylene groups which together with the nitrogen atom may form an aromatic or non-aromatic heterocyclic ring provided that if the heterocyclic group contains a —C=N— bond, $R_3$ is the second bond.

2. The process of claim 1 wherein the surface to be cleaned is contacted with the solution at a temperature of from at least about 50° C.

3. The process of claim 1 wherein the surface to be cleaned is contacted with the solution at a temperature of from about 50° to about 95° C.

4. The process of claim 1 wherein the surface to be cleaned is contacted with the solution at a temperature of from about 70° to about 95° C.

5. The process of claim 1 wherein $R_1$, $R_2$, $R_3$ and $R_4$ are alkyl groups containing from 1 to about 10 carbon atoms.

6. The process of claim 1 wherein $R_1$, $R_2$, $R_3$ and $R_4$ are alkyl groups containing from 1 to 4 carbon atoms.

7. The process of claim 1 wherein $R_1$, $R_2$, $R_3$ and $R_4$ are methyl or ethyl groups.

8. The process of claim 1 wherein the solution comprises water and from about 0.1% to about 60% by weight of the quaternary ammonium hydroxide.

9. The process of claim 1 wherein the solution comprises water and from about 5% to about 40% by weight of the quaternary ammonium hydroxide.

10. The process of claim 1 wherein the solution comprises water and from about 10% to about 15% by weight of the quaternary ammonium hydroxide.

11. The process of claim 1 wherein the solution also contains at least one supplemental surfactant.

12. The process of claim 1 wherein the solution comprises an alcohol and from about 0.1 to about 60% by weight of the quaternary ammonium hydroxide.

13. The process of claim 1 wherein the inorganic substance is polysilicon.

14. A process for cleaning quartz and silicon surfaces by removing inorganic substances from said surface which comprises contacting the surface to be cleaned with an aqueous solution at a temperature and for a period of time effective to remove said substances from the surface, said aqueous solution comprising water and from about 5 to about 40% by weight of at least one quaternary ammonium hydroxide characterized by the formula

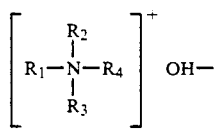 (I)

wherein $R_1$, $R_2$, $R_3$ and $R_4$ are each independently alkyl groups containing from 1 to about 10 carbon atoms.

15. The process of claim 14 wherein $R_1$, $R_2$, $R_3$ and $R_4$ are each independently methyl or ethyl groups.

16. The process of claim 14 wherein $R_1$, $R_2$, $R_3$ and $R_4$ are methyl groups.

17. The process of claim 14 wherein the surface to be cleaned is contacted with the aqueous solution by spraying or immersion.

18. The process of claim 14 wherein the inorganic substance is a polysilicon.

19. The process of claim 14 wherein the inorganic substances comprises poly-silicon and silica and the surfaces containing said substances are precleaned by contacting the surfaces with a dilute aqueous mineral acid containing from about 0.1 to 5% of the mineral acid to remove silica, and thereafter contacted with the aqueous solution comprising the quaternary ammonium hydroxide to remove polysilicon.

* * * * *